United States Patent [19]

Koenck

[11] Patent Number: 4,737,702
[45] Date of Patent: Apr. 12, 1988

[54] BATTERY CHARGING CONTROL SYSTEM PARTICULARLY FOR HAND HELD DEVICE

[75] Inventor: Steven E. Koenck, Cedar Rapids, Iowa

[73] Assignee: Norand Corporation, Cedar Rapids, Iowa

[21] Appl. No.: 944,503

[22] Filed: Dec. 18, 1986

Related U.S. Application Data

[60] Continuation-in-part of Ser. No. 876,194, Jun. 19, 1986, which is a division of Ser. No. 797,235, Nov. 12, 1985, which is a continuation-in-part of Ser. No. 612,588, May 17, 1984, Pat. No. 4,553,081, which is a continuation-in-part of Ser. No. 385,830, Jun. 7, 1982, Pat. No. 4,455,523.

[51] Int. Cl.$^4$ .............................................. H02J 7/04
[52] U.S. Cl. .......................................... 320/40; 320/5; 320/21; 320/23; 320/33; 320/36
[58] Field of Search .................. 320/5, 21, 22, 23, 31, 320/32, 33, 35, 36, 39, 40

[56] References Cited

U.S. PATENT DOCUMENTS 3,775,659 11/1973 Carlsen, II .............................. 320/21
4,472,672 9/1984 Pacholok ................................ 320/21

Primary Examiner—Patrick R. Salce
Assistant Examiner—Anita M. Ault
Attorney, Agent, or Firm—Neuman, Williams, Anderson & Olson

[57] ABSTRACT

In a preferred embodiment, a closed loop control system of a hand held data processing device varies the duty cycle of a battery charging source to match a desired charge rate. Such desired charge rate may be selected according to ambient temperature, for example. A variable duty cycle voltage waveform may energize an inductance such that battery current builds up and decays in each operating cycle. The resulting periodically fluctuating battery current may be sampled at successive sampling points in respective widely separated operating cycles and the samples summed to obtain a measure of actual battery charging current. With each new sample, a revised average may be obtained and used to correct the duty cycle of the energizing voltage as needed to maintain the desired charge rate. The current sampling means may also be used to obtain a measure of battery discharge current during a deep discharge conditioning of the battery and during portable operation so that the hand held device may compute and display remaining battery capacity whenever desired during use.

33 Claims, 15 Drawing Sheets

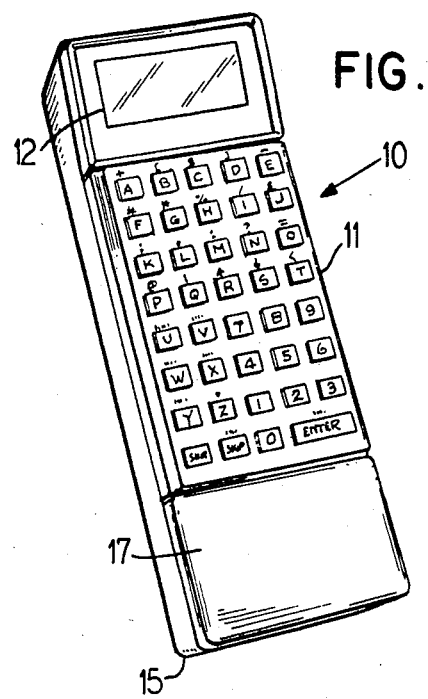
FIG. 1
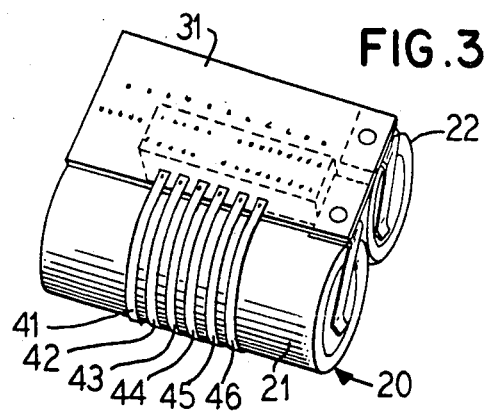
FIG. 3
FIG. 4
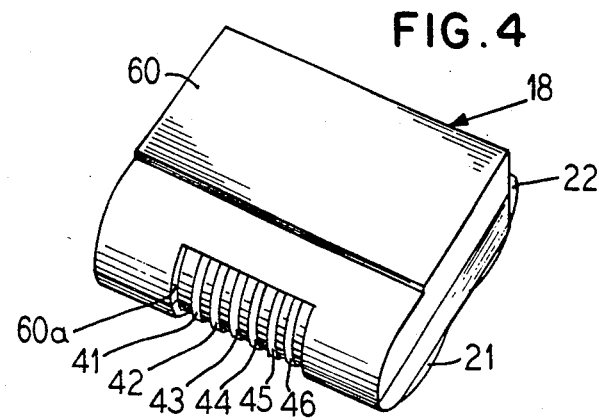
FIG. 2
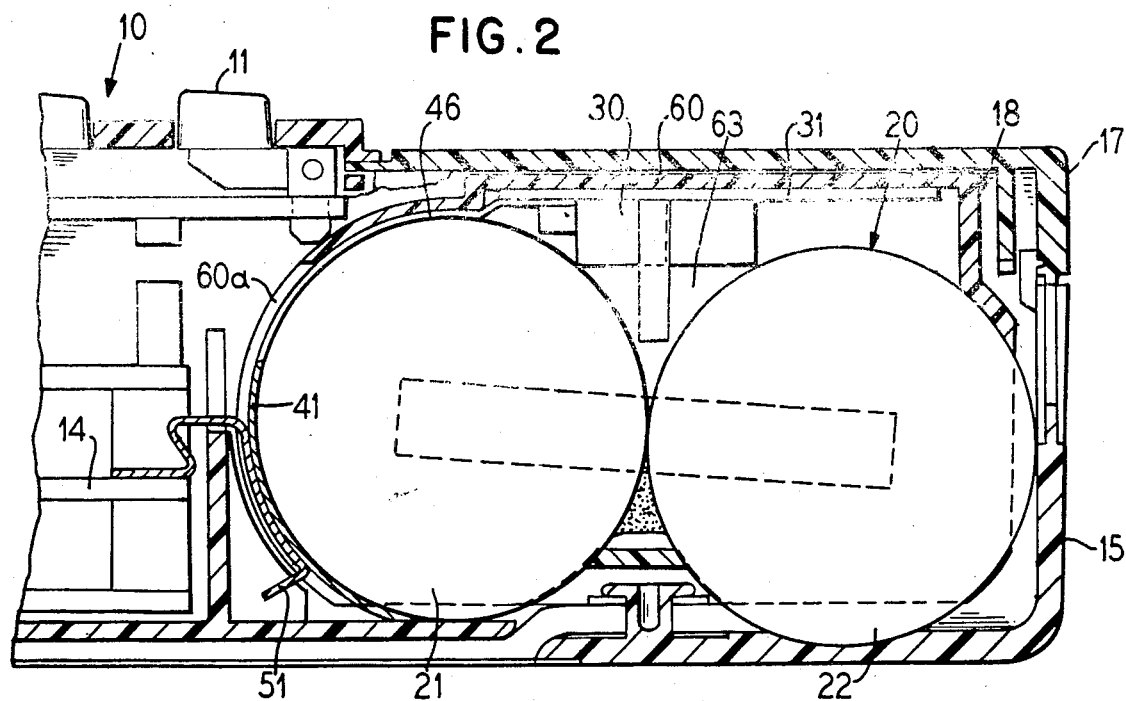

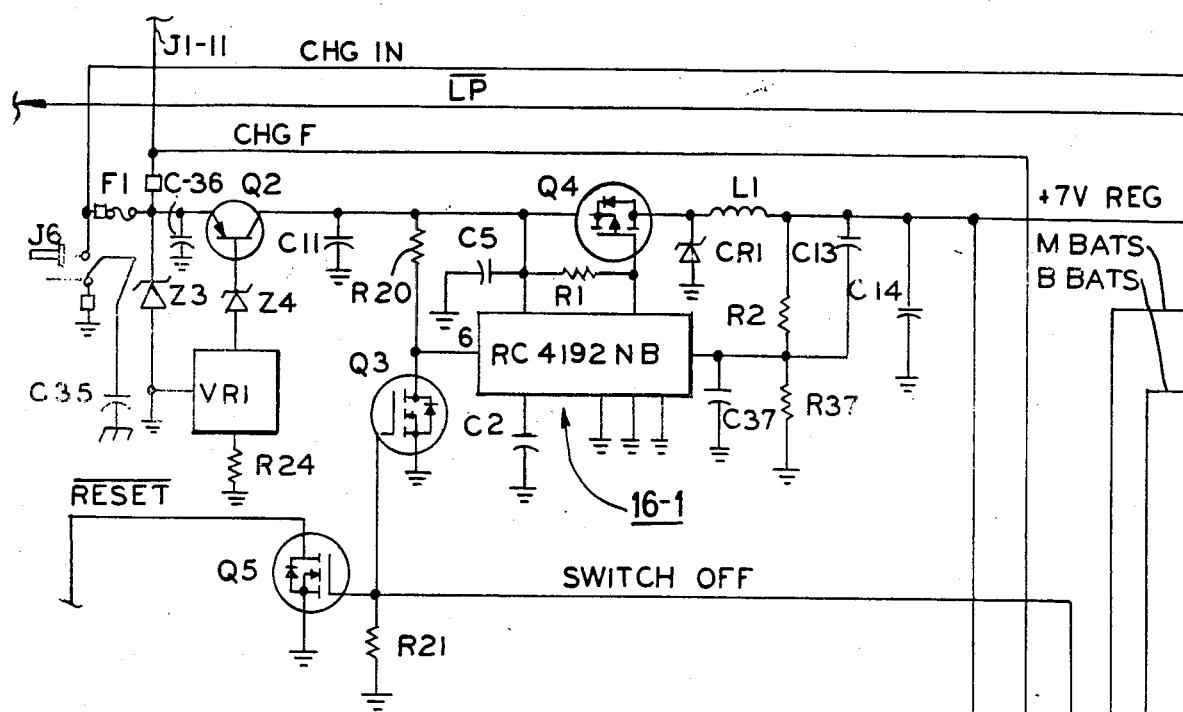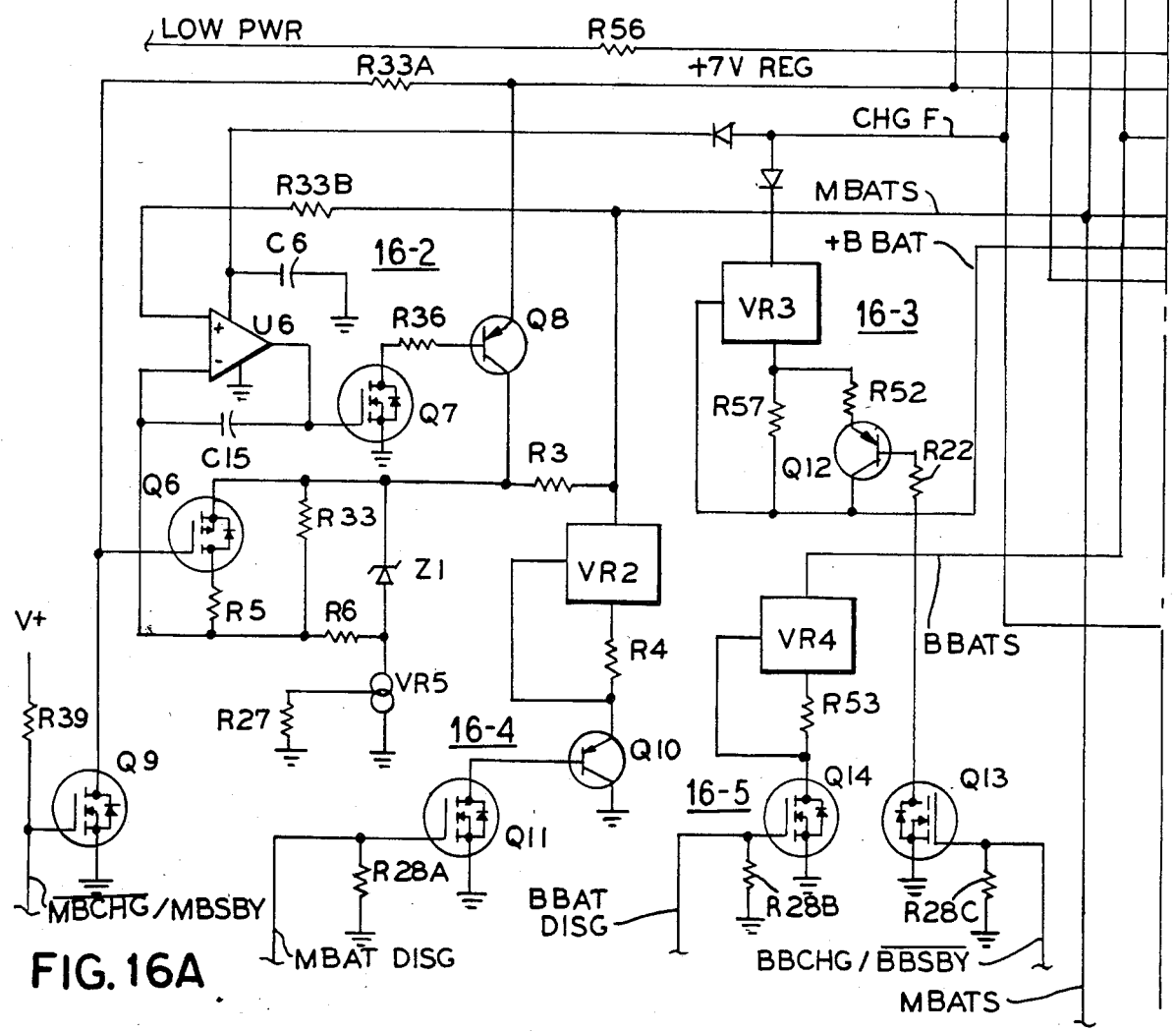
FIG. 16A

BATTERY CHARGING CONTROL SYSTEM PARTICULARLY FOR HAND HELD DEVICE

CROSS-REFERENCE TO RELATED APPLICATIONS

This application is a continuation-in-part of Ser. No. 876,194 filed June 19, 1986, which is a division of Ser. No. 797,235 filed Nov. 12, 1985, which is a continuation-in-part of Ser. No. 612,588 filed May 17, 1984 (now U.S. Pat. No. 4,553,081 issued Nov. 12, 1985), which is a continuation-in-part of application Ser. No. 385,830 filed June 7, 1982 (now U.S. Pat. No. 4,455,523 issued June 19, 1984).

INCORPORATION BY REFERENCE

The disclosures and drawings of the above-mentioned U.S. Pat. Nos. 4,455,523 and 4,553,081, and of the pending application U.S. Ser. No. 876,194 are hereby incorporated herein by reference in their entirety.

BACKGROUND OF THE INVENTION

The present invention relates to portable battery powered systems and particularly to a control system for portable devices capable of optimizing the performance of a rechargeable electrochemical storage medium while at the same time maximizing its useful life. The invention also relates to control systems generally, and especially to control systems forming part of hand held units.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances, a loss of adequate battery power can be just as detrimental as any other malfunction.

Particularly in the field of portable equipment, and especially for hand held devices, any necessary control systems should be lightweight and compact, and should consume minimum power. For the sake of economy, a microprocessor of a standard design and of minimum complexity, is highly desirable.

SUMMARY OF THE INVENTION

It is a basic objective of the present invention to provide a portable battery powered system of increased reliability and useful life.

A further object of the present invention is to provide a control system particularly adapted to control battery charging current, and which control system is of lightweight and compact design so as to be uniquely suited for use in hand held devices.

Another object of the invention is to provide a current regulator system which is not only lightweight and compact but which consumes minimum power, and which preferably is adapted to use with an integrated circuit programmed processor of an economical and simple construction.

An important feature of the invention resides in the provision of a portable system wherein the user can obtain a relatively accurate indication of the battery energy remaining available for use at any time during a portable operating cycle. Further, the user can be automatically alerted when battery capacity diminishes to a selected value, or when battery output voltage is at a selected marginal level.

For the sake of recharging of a battery system as rapidly as possible without detriment to an optimum useful life span, battery parameters including battery temperature can be monitored during a charging cycle and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system currently in use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a back-up battery are present, the operation time of each may be individually accumulated, and used to control the time duration of the respective recharging operations.

Additional features of a preferred commercial system include individual charging and discharging circuits for a main battery and a back-up battery for reliable conditioning of the back-up battery independently of the state of the main battery. Desired parameters such as main battery voltage, back-up battery voltage, ambient temperature (e.g. in the main battery case or in the battery compartment), and charging voltage may be obtained by means of an integrated circuit analog to digital converter, which thus replaces several comparators and many precision costly components of a prior implementation.

A feature generally applicable to voltage regulated power supplies resides in utilizing a regulator signal which departs markedly from its normal range as input voltage falls below a prescribed value. Such regulator signal may be utilized to switch to a different power source automatically, and/or to generate a suitable low power signal for external circuits, e.g. for controlling the issuance of a user-discernible low power warning. In a preferred implementation, an operational amplifier supplies a current control signal which controls one or more current flow paths to maintain a desired regulated output voltage. A common saturation signal from the operational amplifier may result from a low power condition of any of several input sources which are connected to respective selectively activated regulator circuits. Where desired, a plurality of regulator circuits may be shifted from one set point voltage value to another by switching of the input circuitry of the operational amplifier, and the saturation signal will then represent a low power condition in relation to the other selected set point voltage value. The second regulated output voltage value may, for example, be desired in conjunction with a "power down" mode of battery powered equipment (e.g. CMOS dynamic memory circuits).

While in an early embodiment, battery charging current was set using a digital to analog converter to establish a set point for an analog current control loop, it is a feature of a further embodiment herein to provide a digital computer for both computing a desired current set point and for modulating current pulses in the battery charging circuit for maintaining a desired average current. Preferably, a computer circuit with a moderate clock rate may determine current pulse modulation steps and control sampling of actual current pulses for purposes of generating a feedback signal. An aliasing type of sampling systematically taken at different phases of the actual current pulse waveform enables use of a particularly low sampling rate.

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIGS. 1 through 17 and the brief description thereof are incorporated herein by reference to U.S. Ser. No. 876,194, now U.S. Pat. No. 4,709,202 issued 11/24/87;

DETAILED DESCRIPTION

The detailed description of FIGS. 1 through 17 is incorporated herein by reference to U.S. Ser. No. 876,194, now U.S. Pat. No. 4,709,202 issued 11/24/87.

DESCRIPTION OF FIGS. 18, 19, 20A, 20B, 21 AND 22

Figure 18:
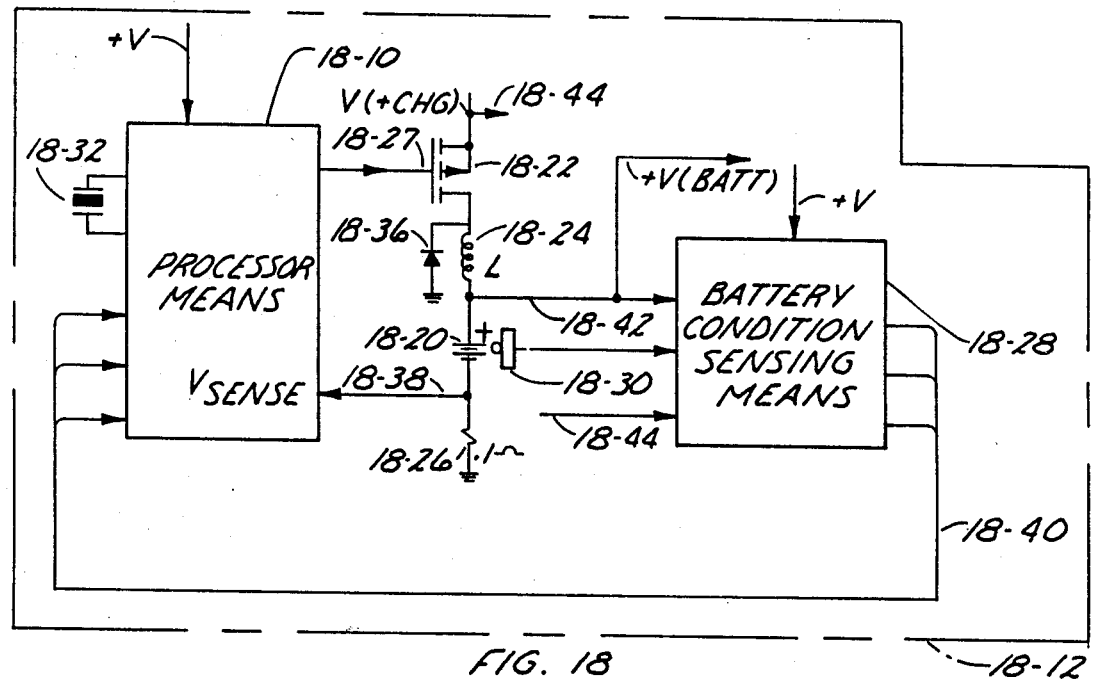
FIG. 18 is an electric circuit diagram for illustrating a preferred embodiment of battery charging current control system in accordance with the present invention.
Figure 20A:
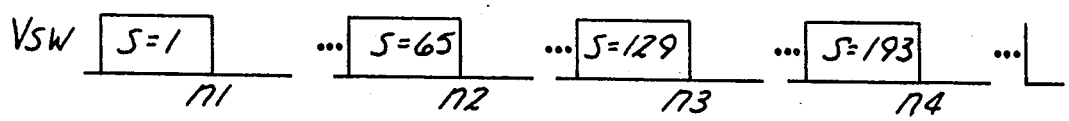
FIG. 20A shows selected control pulses which may be generated during control of battery charging current in the control system of FIG. 18.

FIG. 18 shows processor means such as an integrated circuit microprocessor 18-10 which may form part of a circuit package of a battery pack 18-12. The circuit package may be secured with a rechargeable battery means 18-20, an association of such parts being shown in detail in FIGS. 2, 3 and 4. During a battery charging operation, a battery charging means such as 12-24, FIG. 12, may provide a charging potential to a hand held computer unit such as 71, FIG. 5, and the unit 71 may supply an operating voltage $+V$ to microprocessor 18-10 and may supply a charging potential $+CHG$ to a series circuit including a current switch or current regulator means 18-22, an energy storage inductor means 18-24, battery means 18-20, and a current sense resistor 18-26. The processor means 18-10 may supply to line 18-27 rectangular pulses of a voltage waveform Vsw as shown in FIG. 20A. The duration or active duty cycle of the voltage pulses of waveform Vsw is modulated in discrete modulation steps to vary the turn-on time of switch means 18-22, and thus to vary battery charging current.

As in the embodiment of FIGS. 1 through 8, battery means 18-20 may have battery charging parameter sensing means associated therewith as indicated at 18-28. Such parameter sensing means may have a battery temperature sensing transducer 18-30 corresponding to transducer 134, FIG. 9-A, and transducer 18-30 may be physically disposed in heat transfer relation to battery pack 18-12 as indicated in FIG. 18.

In the embodiment of FIG. 18, processor means 18-10 may be controlled by a constant frequency means such as crystal 18-32. The clock rate of crystal 18-32 may be used to synchronize turn on of switch means 18-22 so that active duty cycles are initiated at a uniform time interval of less than one microsecond and may provide a desired number of modulation steps for the active duty cycle of the turn-on waveform Vsw. By way of example, the operating frequency of crystal 18-32 may be six megahertz (i.e. thirty-two times a duty cycle frequency of 187.5 kilohertz) and may provide a time interval between activations of switch means 18-22 of 5.3333 microseconds with each such time interval being subdivided into thirty-two modulation steps. A moderate operating frequency of crystal 18-32 is favorable for a control system with low energy consumption, and an economical processor means.

Figure 19:
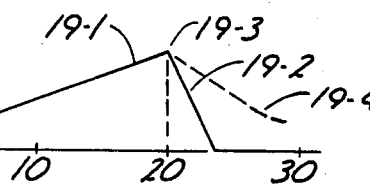
FIG. 19 shows an exemplary current pulse waveform which may correspond with a maximum battery charging rate in a substantially linear operating range for an exemplary control system in accordance with FIG. 18.

In the above example, the turn-on time of switch means 18-22 may have different possible time durations per cycle corresponding to respective different numbers of the thirty-two modulation steps. The modulation steps may represent increments of 166.7 nanoseconds in the time duration of the active duty cycle of the waveform Vsw at line 18-27. Essentially, maximum current flow in inductor 18-24 may correspond with a turn-on time corresponding to at least sixty percent of the maximum available on-time of switch means 18-22. For example, current flow may increase relatively linearly as represented in FIG. 19 by sloping line 19-1 for numbers of time increments between zero and twenty or more. The circuit of FIG. 18 includes means such as diode 18-36 for maintaining current flow when switch means 18-22 is turned off, the circuit preferably providing a current decay characteristic generally as indicated at 19-2 in FIG. 19. Generally the current may decay to zero in less than one-half of the turn-on time of switch means 18-22, for the case of active duty cycles which provide a linear characteristic such as 19-1. For example, if the peak value 19-3 in FIG. 19 corresponds to twenty time increments or 3.33 microseconds (20 times 166.7 nanoseconds equals 3.33 microseconds), then the decay interval may be less than ten increments, i.e. less than 1.67 microseconds.

FIG. 20A shows turn-on pulses Vsw of relatively constant duration, corresponding to numbers of turn-on increments, e.g. n1=16, n2=17, n3=17, n4=18.

Figure 20B:
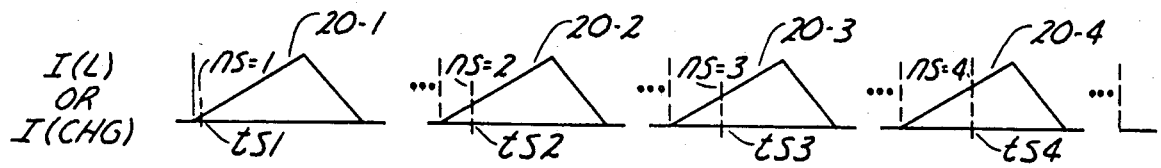
FIG. 20B shows respective corresponding battery charging current pulses on the same time scale with vertically aligned portions of the waveforms of FIGS. 20A and 20B occurring at the same time.

FIG. 20B shows the corresponding current flow in inductance 18-24, designated I(L) and the corresponding battery charging current I(CHG).

In each case, the rising current characteristics 20-1 to 20-4 are linear where the number of increments is less than the number corresponding to peak 19-3 in FIG. 19.

In FIG. 18, current sense resistance 18-26 is of a value much less than the resistance of battery means 18-20; for example, resistance means 18-26 may have a resistance value of 0.1 ohm. FIG. 20B thus also represents the waveform Vsense supplied at line 18-38 of FIG. 18, for the respective durations of Vsw of FIG. 20A. The processor means 18-10 includes analog to digital converter channels such as that associated with resistor 135, FIG. 9A, so that the battery temperature analog signal at 18-40 and the battery current analog signal at 18-38 may be converted into corresponding digital values.

While waveforms such as those represented in FIG. 20B would normally be sampled at a relatively high rate in comparison with the operating frequency of component 18-32, in a preferred embodiment the sampling rate of the pulsating analog waveform at line 18-38 is made lower than the rate of component 18-32 and preferably less than the active duty cycle frequency of waveform Vsw. Thus, the analog to digital converter means of processor 18-10 preferably deliberately under samples the current sense line 18-38 to alias the charging current waveform I(CHG) to a very low frequency.

For the example of a repetition rate Fsw for the active duty cycles of waveform Vsw of 187.5 kilohertz, sampling may take place roughly at a frame sampling rate of 1/64 Fsw or roughly 2929 hertz. The actual aliasing sampling rate, however, is not precisely synchronized with the switch activation rate Fsw, but differs slightly therefrom, for example, by one time increment or duty cycle modulation step of waveform Vsw, e.g. by a time increment of 166.7 nanoseconds per frame interval. This example of sampling can be visualized if the successive pulses of Vsw as supplied to line 18-27, FIG. 18, are identified as S=1, S=2, S=3, etc., and if the pulses of FIG. 20B are then considered to correspond to Vsw pulse numbers S=1, S=65, S=129 and S=193, as indicated in FIG. 20A, and if the successive sampling points are identified as ns1, ns2, ns3, ns4, etc.

If there are thirty-two different possible sampling points for each Vsw pulse, then FIG. 20B illustrates successive sampling points ns1=1, ns2=2, ns3=3 and ns4=4. In this example, one complete scan of the pulse configuration of the Vsense waveform at line 18-38 would take place for each 2049 Vsw pulses.

Figure 21:
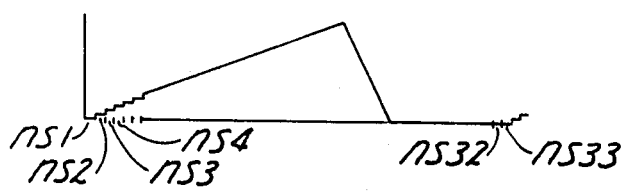
FIG. 21 is a diagrammatic view for use in explaining the aliased sampling of actual current pulses in the battery charging circuit, and illustrating the case where thirty-two samples form a complete sampling cycle.

The resultant sampled waveform for a complete sampling cycle is diagrammatically indicated in FIG. 21 for the example of sampling as represented in FIGS. 20A and 20B.

If the frame sampling rate for the Vsense waveform on line 18-38 is roughly 1/256 Fsw, or about 732.42 hertz, then with one time increment of 167 nanoseconds added for each sampling frame, an actual sampling frequency of about 732.33 hertz results corresponding to 1.3655 milliseconds per sample. If thirty-two sample points of the Vsense waveform are scanned per complete sampling cycle, then one complete sampling cycle corresponds to 0.043696 second, or a frequency of 22.88 hertz.

After each sample of the Vsense waveform, a corresponding average current value can be computed, by adding the most recent sample value (e.g. at ns33, FIG. 21) and subtracting the oldest sample value (e.g. sample ns1, FIG. 21), so that a new average current would be calculated at each 1.3655 milliseconds for the case of a sampling frequency of about 732.33 hertz. A sample and hold circuit may retain the sampled value of Vsense during the analog to digital conversion process.

The preferred embodiment with an aliased sampling rate is considered applicable to current measurements where changes in the current waveform pulses are relatively slow, e.g. slower than the rate of change shown in FIG. 20B, where the alternating polarity component of the Vsense voltage averages out over a complete sampling cycle, and where the need for dynamic regulation of the current I(L) is minimal, i.e. the average direct current level per complete sampling cycle is the critical value to be regulated.

The slow rate aliasing type of sampling is useful to adapt the sampling frequency to that feasible with an economical and simple processing means 18-10 (e.g. a type 8048 microprocessor). Other aliasing sampling approaches could operate by scanning at a desired frame interval less one pulse, e.g. for the example of FIGS. 20A and 20B to sample Vsense at Vsw pulses corresponding to S=1, ns1=1; S=64, ns2=32; S=128, ns3=31; S=192, ns4=30; etc. Other schemes to scan the Vsense signal could both skip frames and slip sample points, e.g. sampling Vsense at Vsw pulses corresponding to S=1, ns1=1; S=128, ns2=32; S=256, ns3=31; S=384, ns4=30; etc., or S=1, ns1=1; S=129, ns2=2; S=257, ns2=3; S=385, ns4=4, etc.

By way of example, processor 18-10 may read battery temperature via input 18-40 at ten second intervals, and adjust the charging current set point value accordingly at each ten second reading of temperature. A noise filter in the form of a digital algorithm may insure that the actual digital current readings based on Vsense are free of disruptive noise.

By way of example, if the waveform of FIG. 19 corresponds to a duration of Vsw of twenty modulation increments and a charging rate of about C/8, then for temperatures of less than minus twenty degrees Celsius (−4° F.), the active duty cycles of Vsw may be set to zero; for temperatures between minus twenty degrees Celsius and minus ten degrees Celsius (+14° F.), the charging current may be set to about C/20 (resulting in an average of about eight modulation increments for each active duty cycle of Vsw); for temperatures between minus ten degrees Celsius and zero degrees Celsius (32° F.), the charging current may be set to about C/16 (resulting in an average of about ten modulation increments for each active duty cycle of Vsw); for temperatures between zero degrees Celsius and ten degrees Celsius (50° F.), the charging current may be set to C/10 (to produce an average of about sixteen modulation increments for each active duty cycle of Fsw); for temperatures between ten degrees Celsius and seventy degrees Celsius (158° F.), the charging rate may be set to about C/8; above seventy degrees Celsius, the charging rate may be set to about C/100, (the active duty cycle of Fsw then varying generally between one modulation increment and two modulation increments in successive ten second intervals).

In a less precise control system, the programming of processor 18-10 may simply provide a table of numbers of modulation increments for the active duty cycle of Fsw according to respective ranges of measured temperature readings in digital form and the values of measured charging current may not enter into the selection of modulation increments. In such an open loop system, the sampling of charging current may be used for the fuel gauge function during normal operation of the hand held unit such as indicated at 10 in FIGS. 1 and 2, or in FIG. 10, or at 12-10, FIG. 12. As described with reference to FIG. 12, the circuitry of FIG. 18 may be permanently associated with the hand held device 10, rather than being a permanent part of the battery pack. As another embodiment, the circuitry of FIG. 18 may be a permanent part of the battery pack along with a casing 60, FIG. 4, while the rechargeable battery means 18-20, FIG. 18, may be readily removable from casing 60 so as to be replaceable without replacement of components such as 18-10, 18-22, 18-24, 18-26, 18-28, 18-30, and 18-32. The transducer 18-30 need not be in physical proximity with the battery means 18-20. The processor 18-10 and switch means 18-22 can be part of the same silicon chip, for example. As indicated at 18-42, sensing means 18-28 may also receive an analog measure of battery voltage as indicated by a V(BATT) input at 18-42 and/or an analog measure of input charging voltage V(+CHG) as indicated at 18-44, and supply such analog measures to an analog to digital channel of processor means 18-10.

In generating the Vsw waveform, the processor 18-10 may load a number equal to the number of desired modulation increments for the active duty cycle of Vsw into a register, and apply a suitable turn on voltage to line 18-27 until a number of clock pulses of oscillator means 18-32 has been counted corresponding to the number selected.

Figure 22:
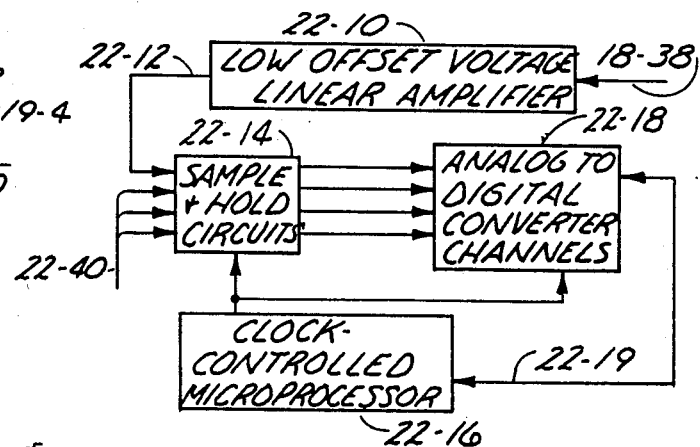
FIG. 22 is a block diagram for illustrating exemplary sampling circuitry for association with the Vsense input of the processor means of FIG. 18.

As indicated in FIG. 22, the voltage across current measuring resistor 18-26, FIG. 18, may be supplied via line 18-38 to a low offset voltage linear amplifier 22-10. The output signal at 22-12 from amplifier 22-10 and the analog signals of multiconductor line 18-40 are supplied to respective sample and hold circuits of component 22-14. Successive samples of the battery current measurement waveform such as indicated at ns1, ns2, ns3, ns4, ..., ns32, ns33, ..., FIG. 21, may be selected by means of microprocessor 22-16 which is controlled by clock 18-32. Each sample may be obtained over a sample interval which may be equal to the clock period interval of one-sixth microsecond, for example, and may be held until it is converted to digital form by component 22-18 and supplied to a register of microprocessor 22-16 e.g. via conductors of a data bus forming part of the interconnecting means 22-19. The other analog signals are similarly sampled and transmitted e.g. to respective further registers of microprocessor 22-16.

The microprocessor 22-16 may be programmed to compute a new average battery charge rate with each sample of actual battery current after the first N samples. The microprocessor would also take account of any changes in battery temperature, for example. As a specific example, it may be desired to maintain a maximum battery charging rate consistent with assurance of prolonged battery life, e.g. avoiding an excessive overcharge rate as discussed in relation to FIG. 6.

Figure 5:
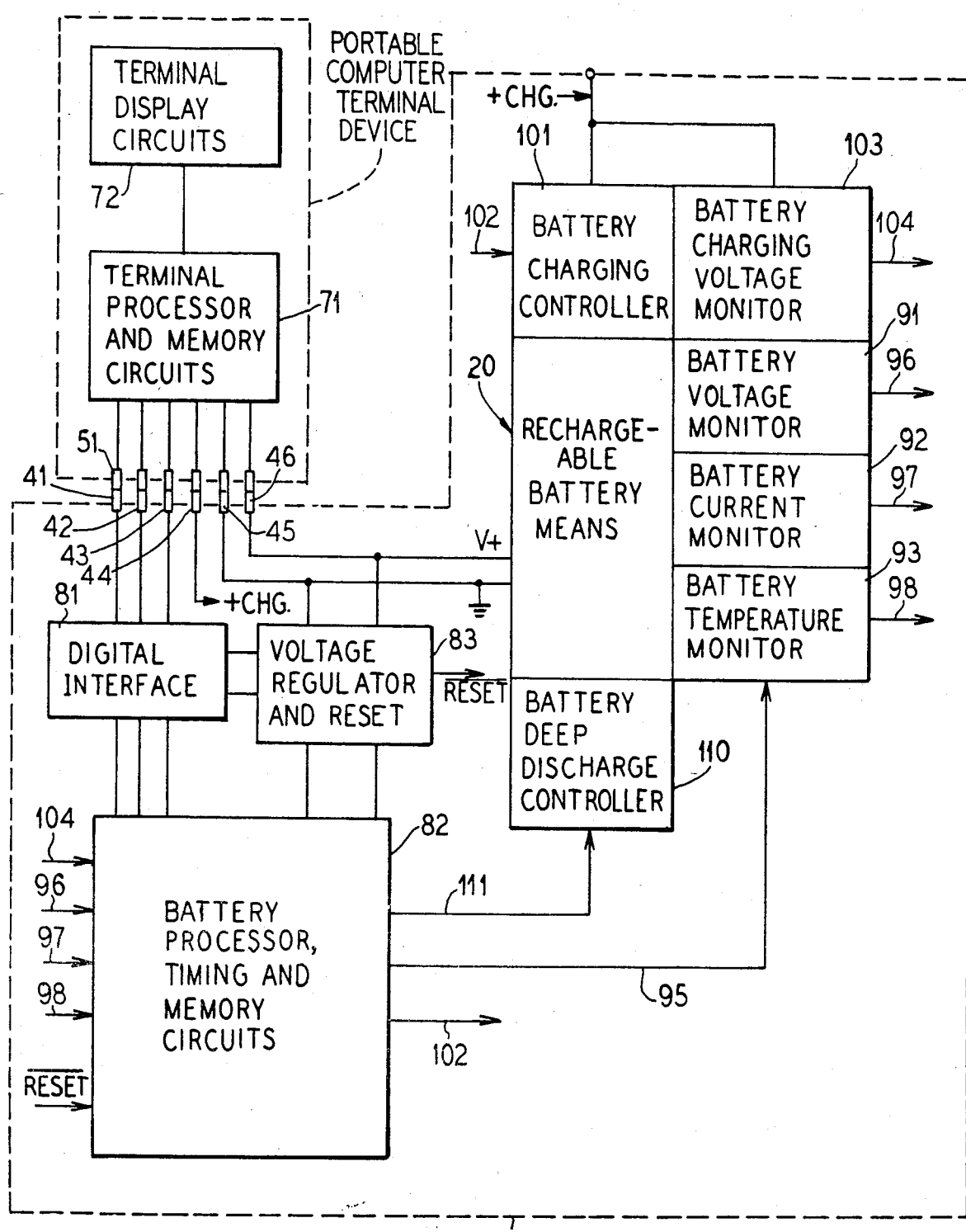
Figure 6:
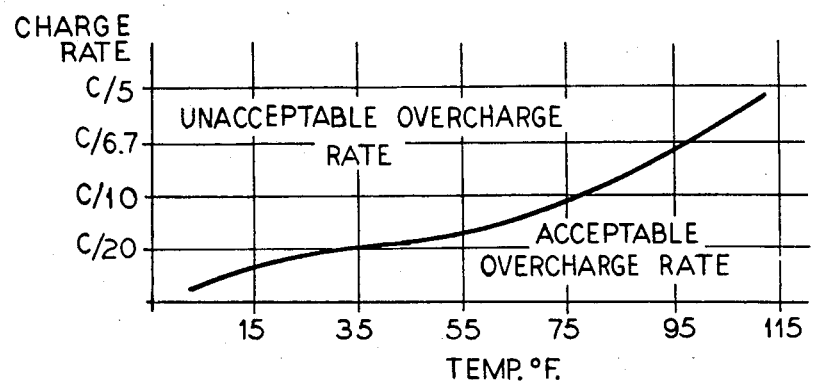
Figure 7:
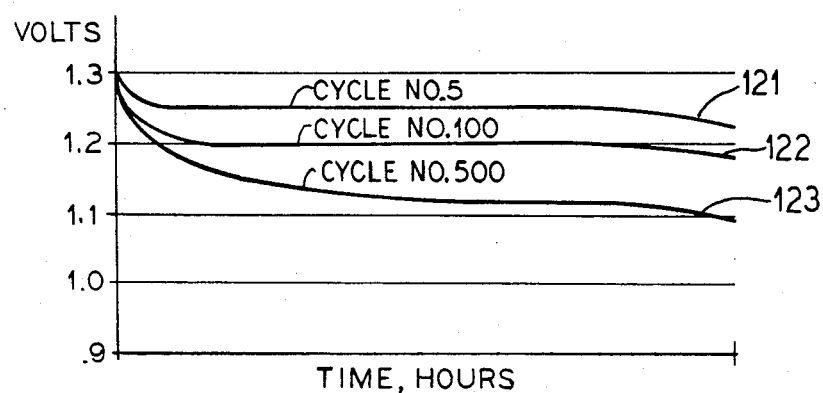
Figure 8:
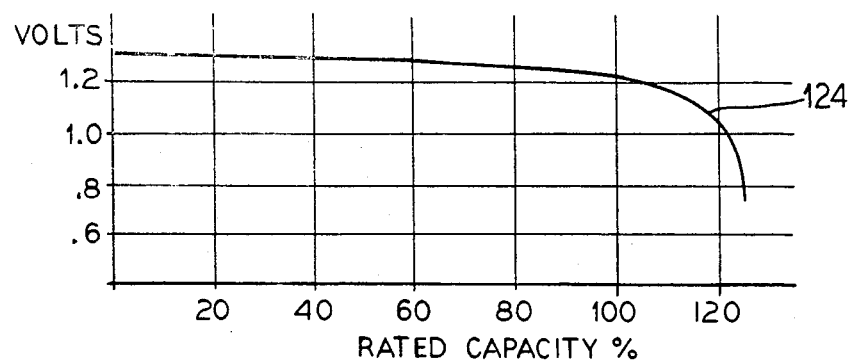
Figure 9A:
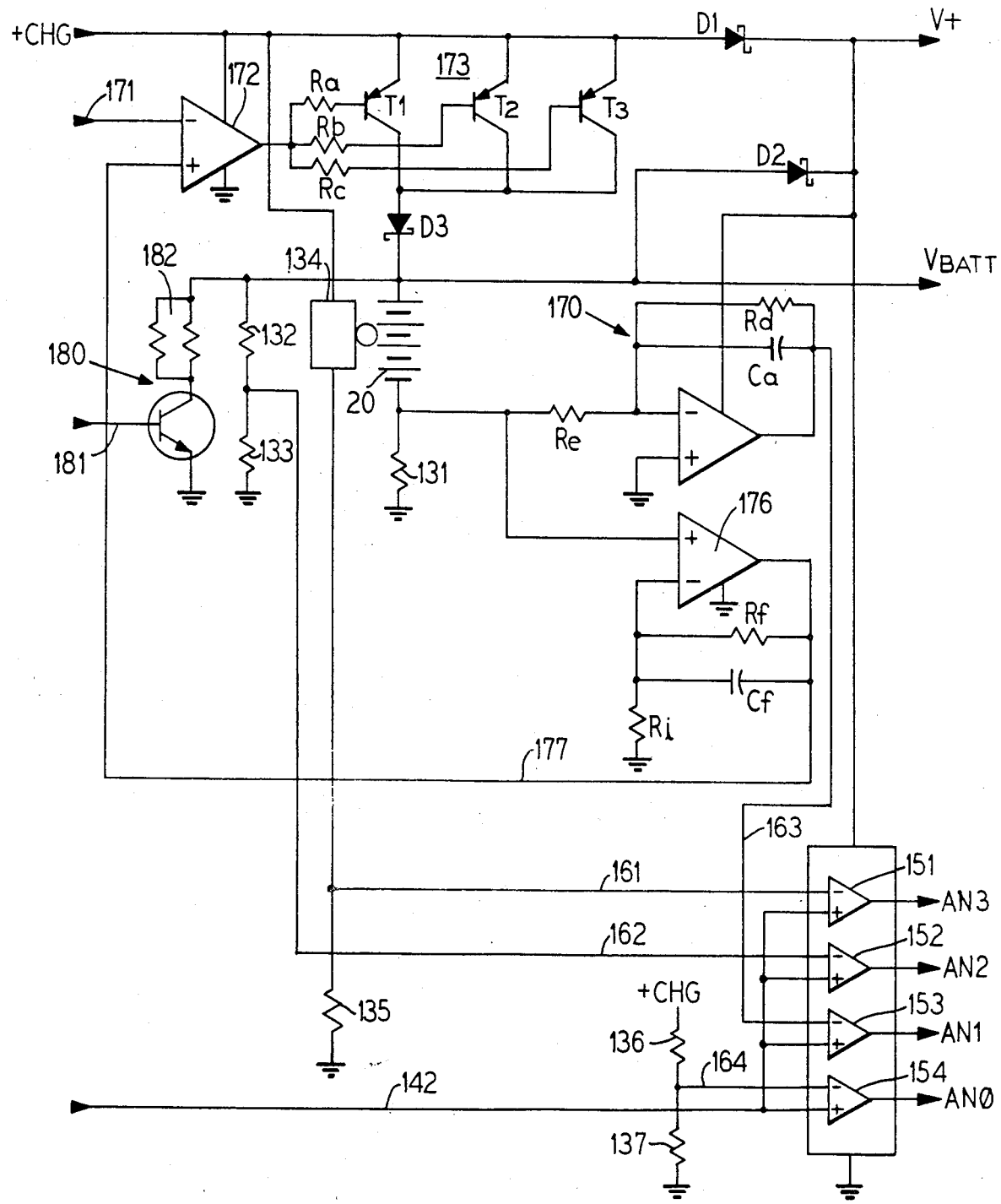
Figure 9B:
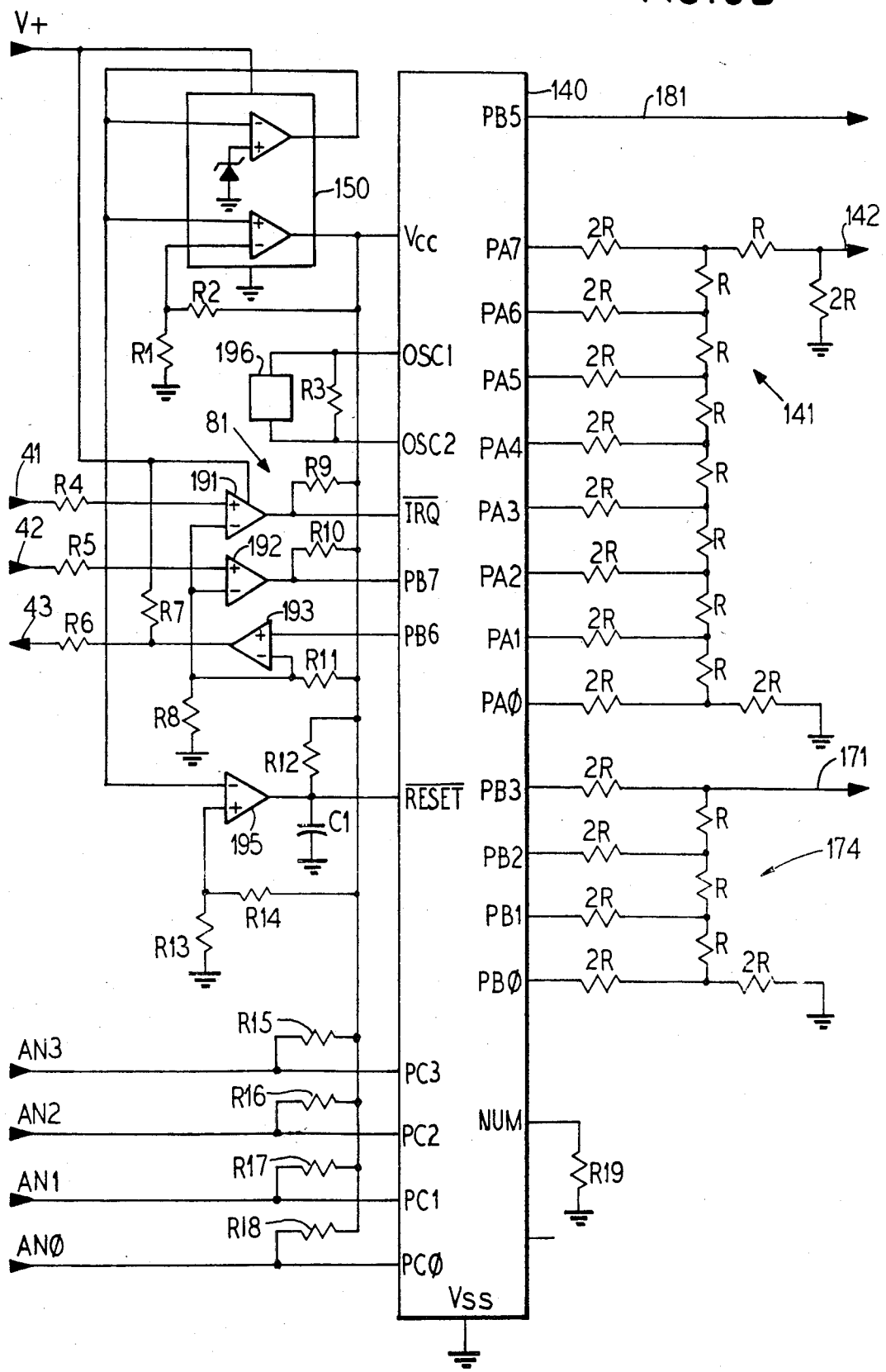
Figure 10:
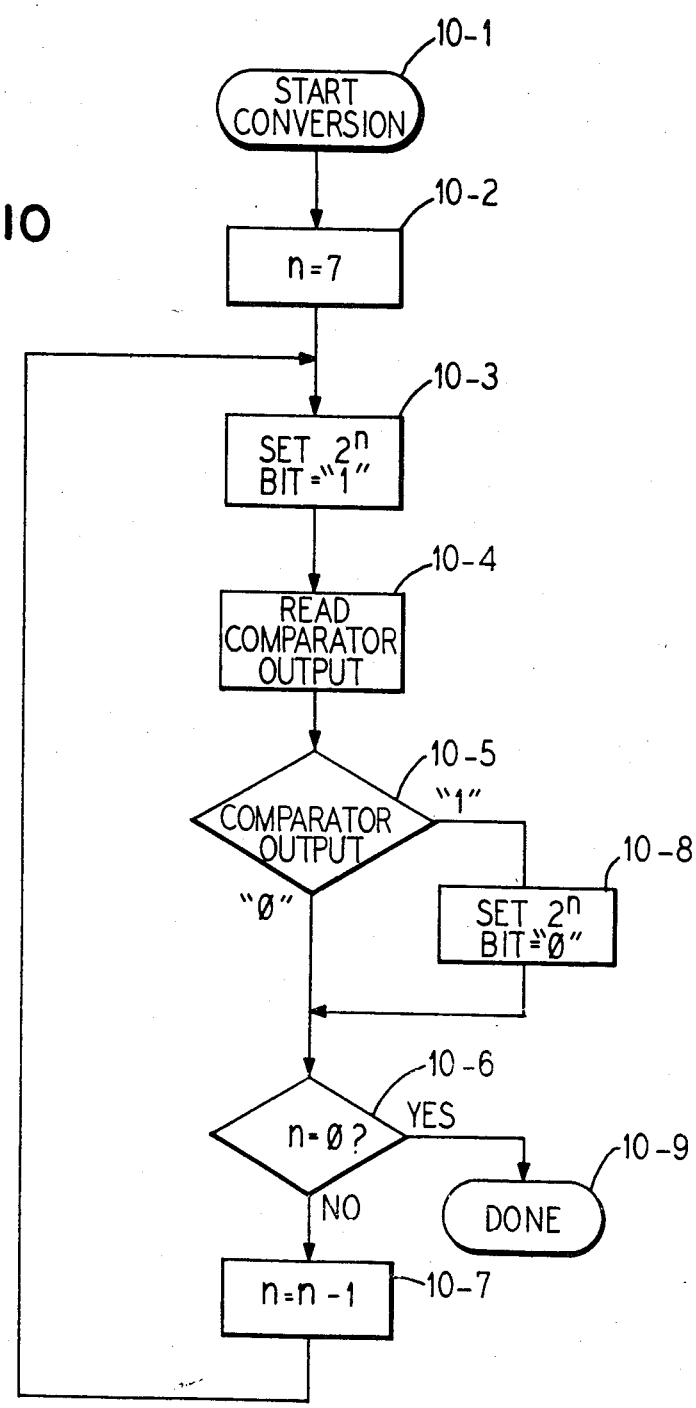
Figure 11:
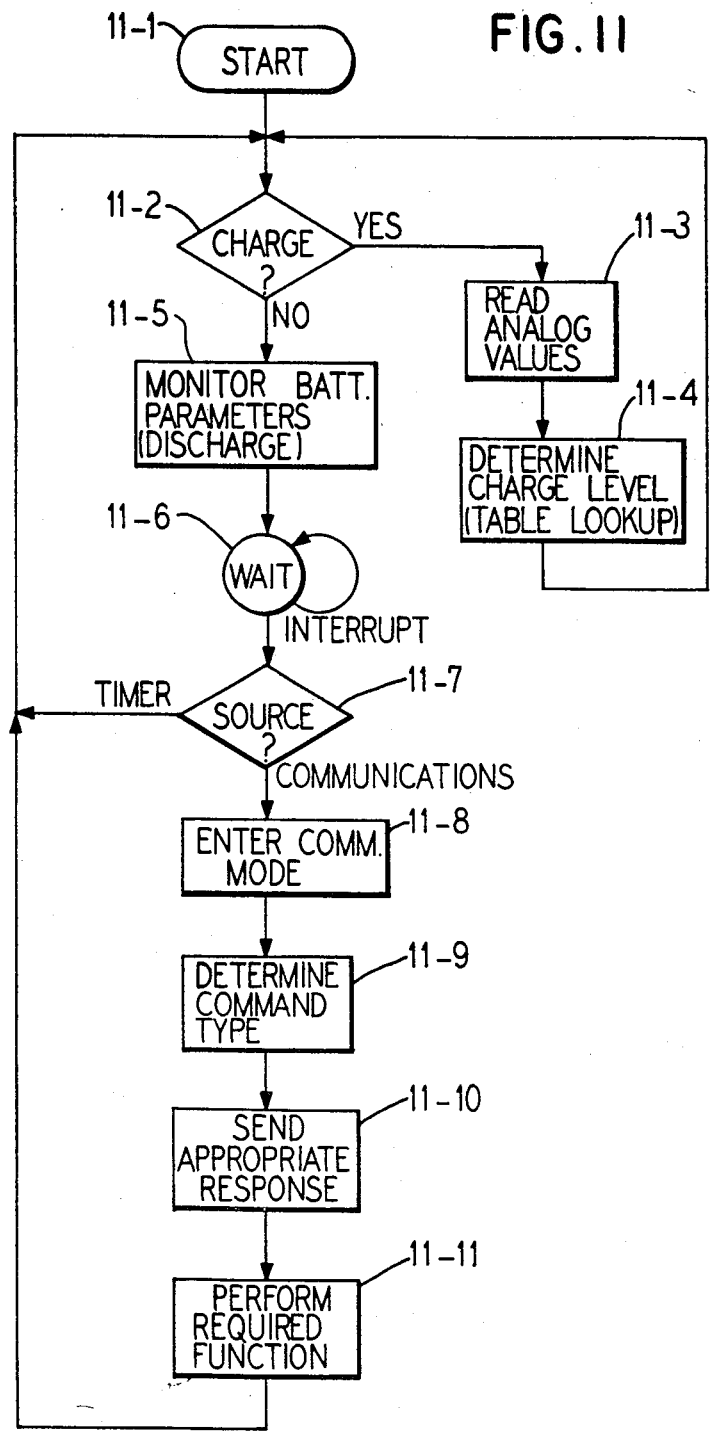
Figure 12:
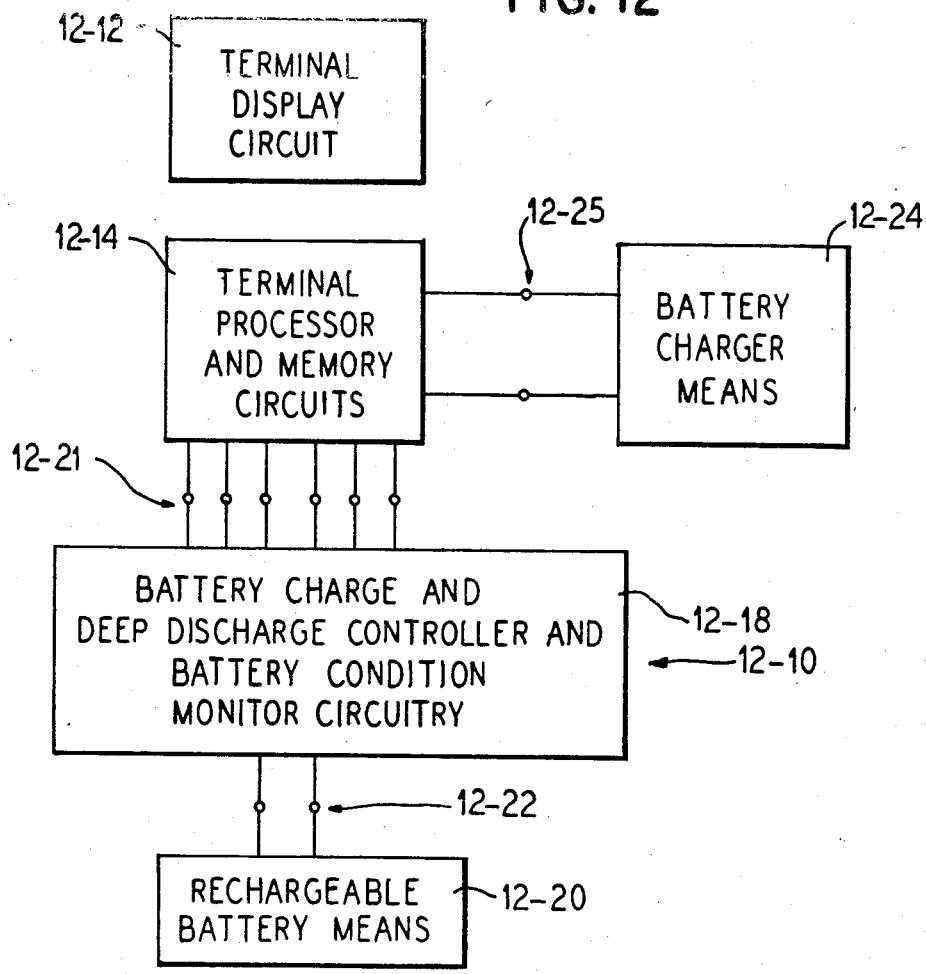
Figure 13:
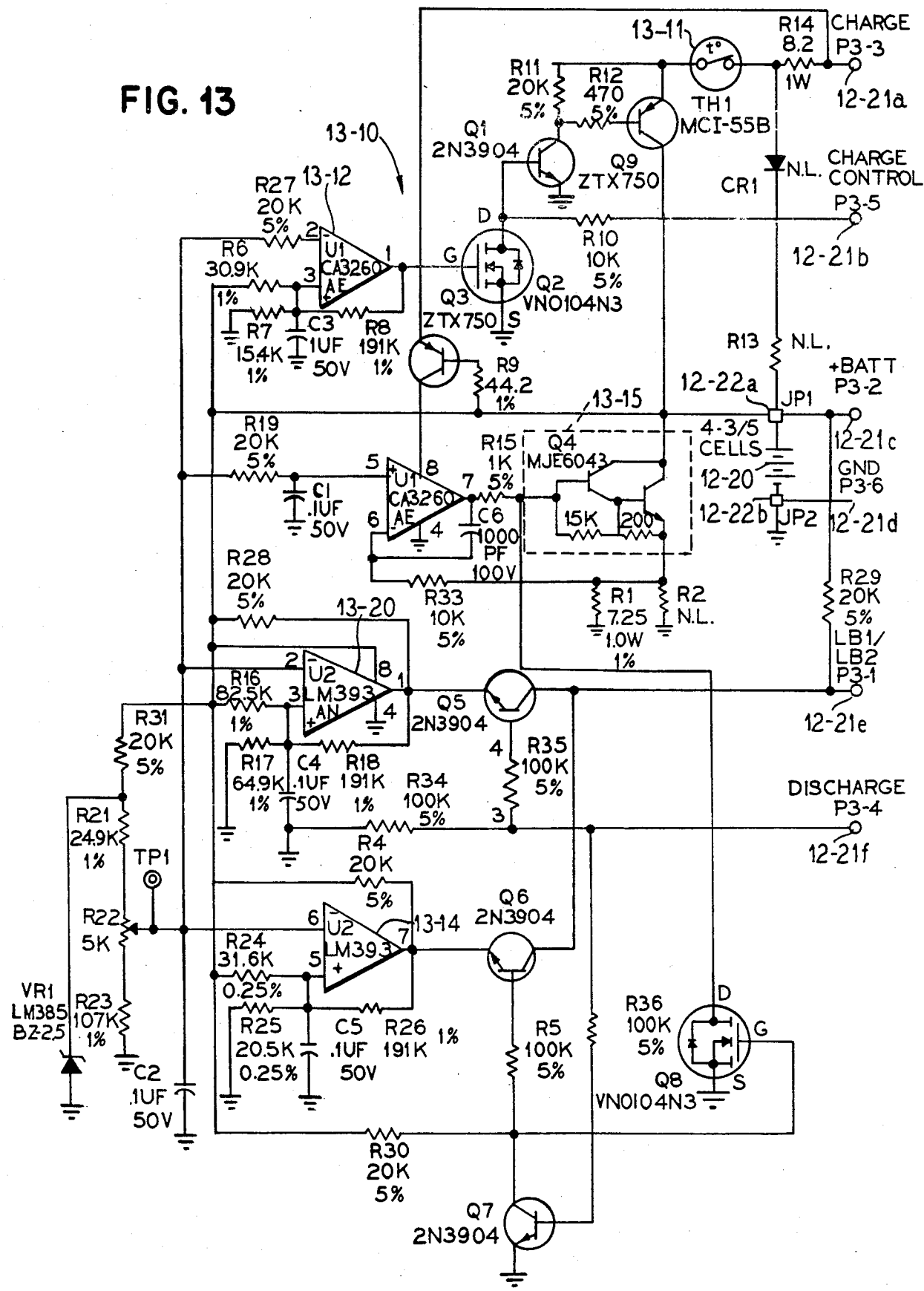
Figure 14:
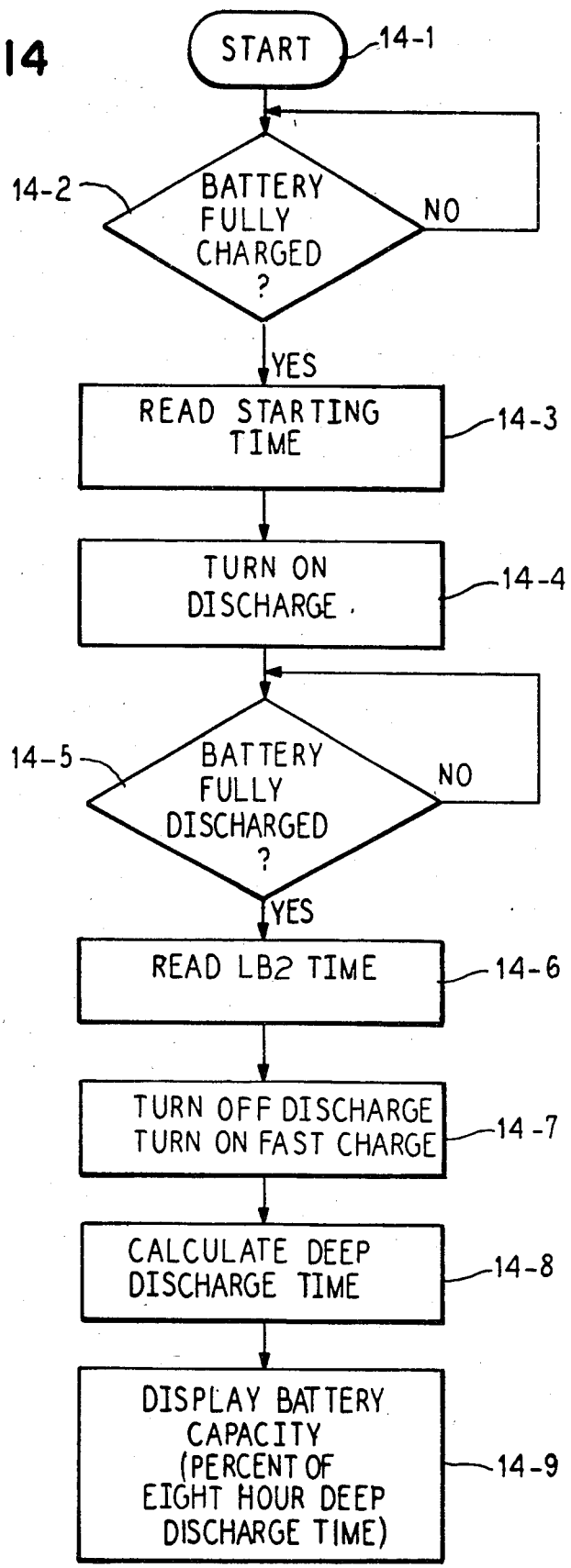
Figure 15:
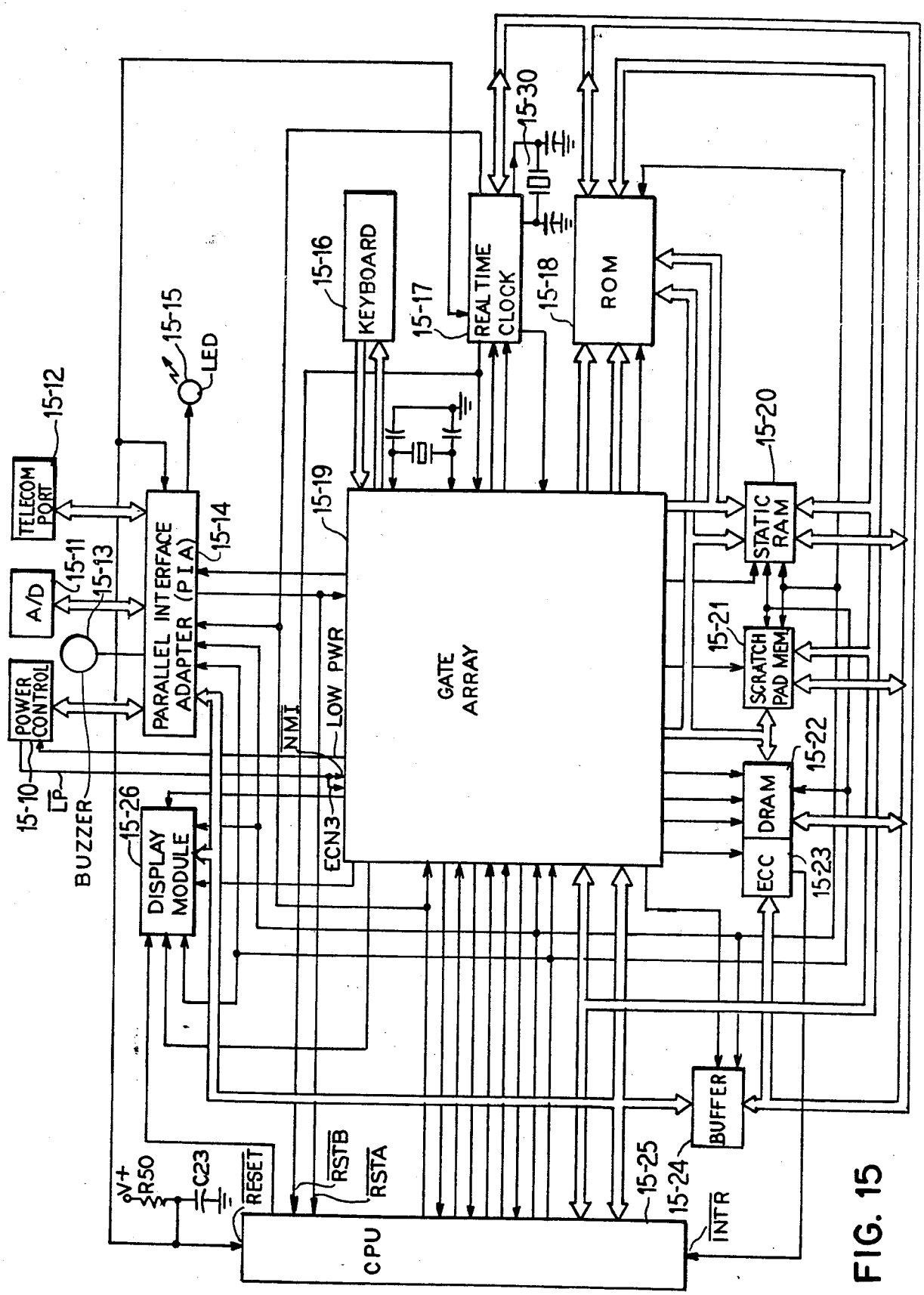
Figure 16B:
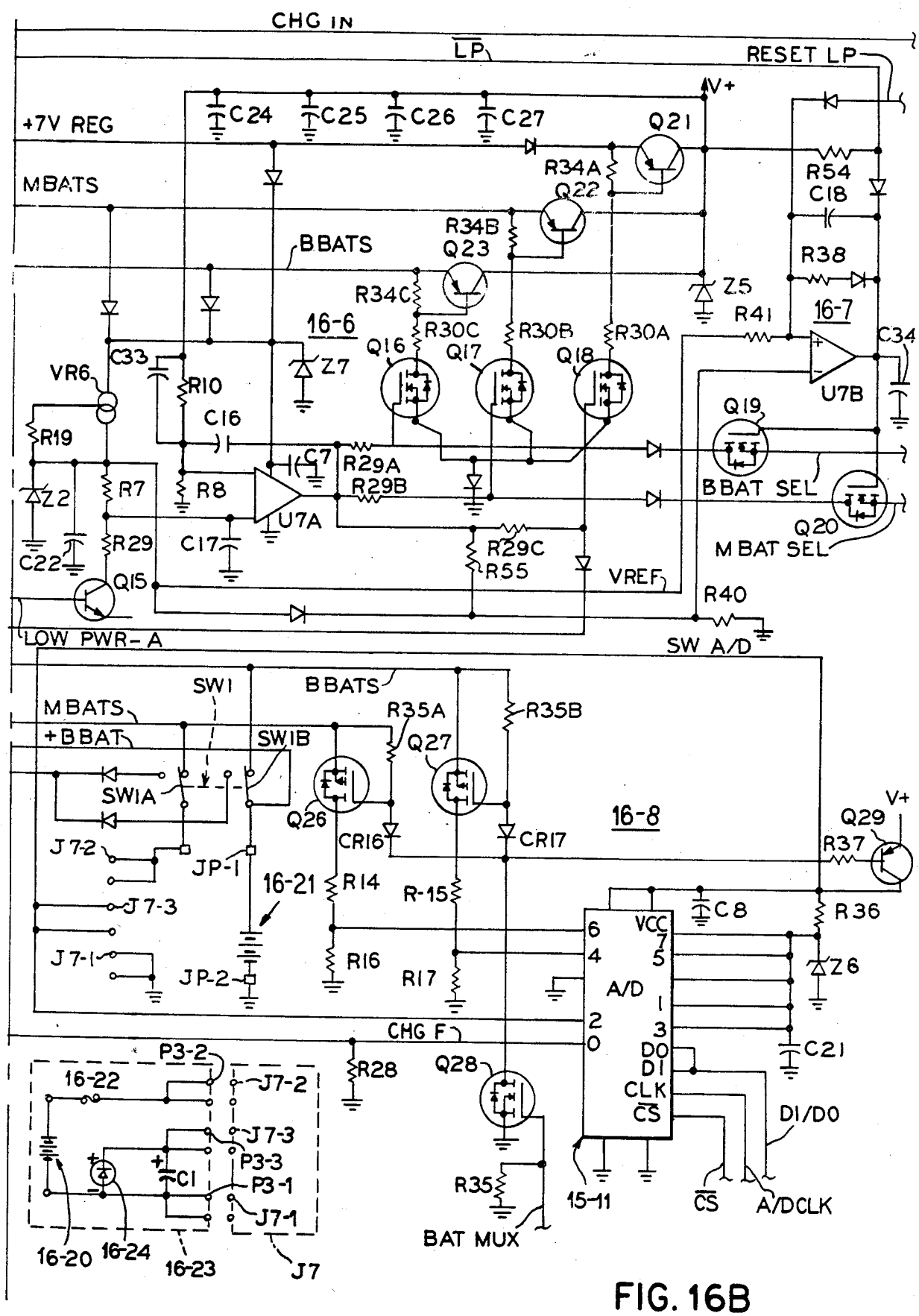
Figure 17:
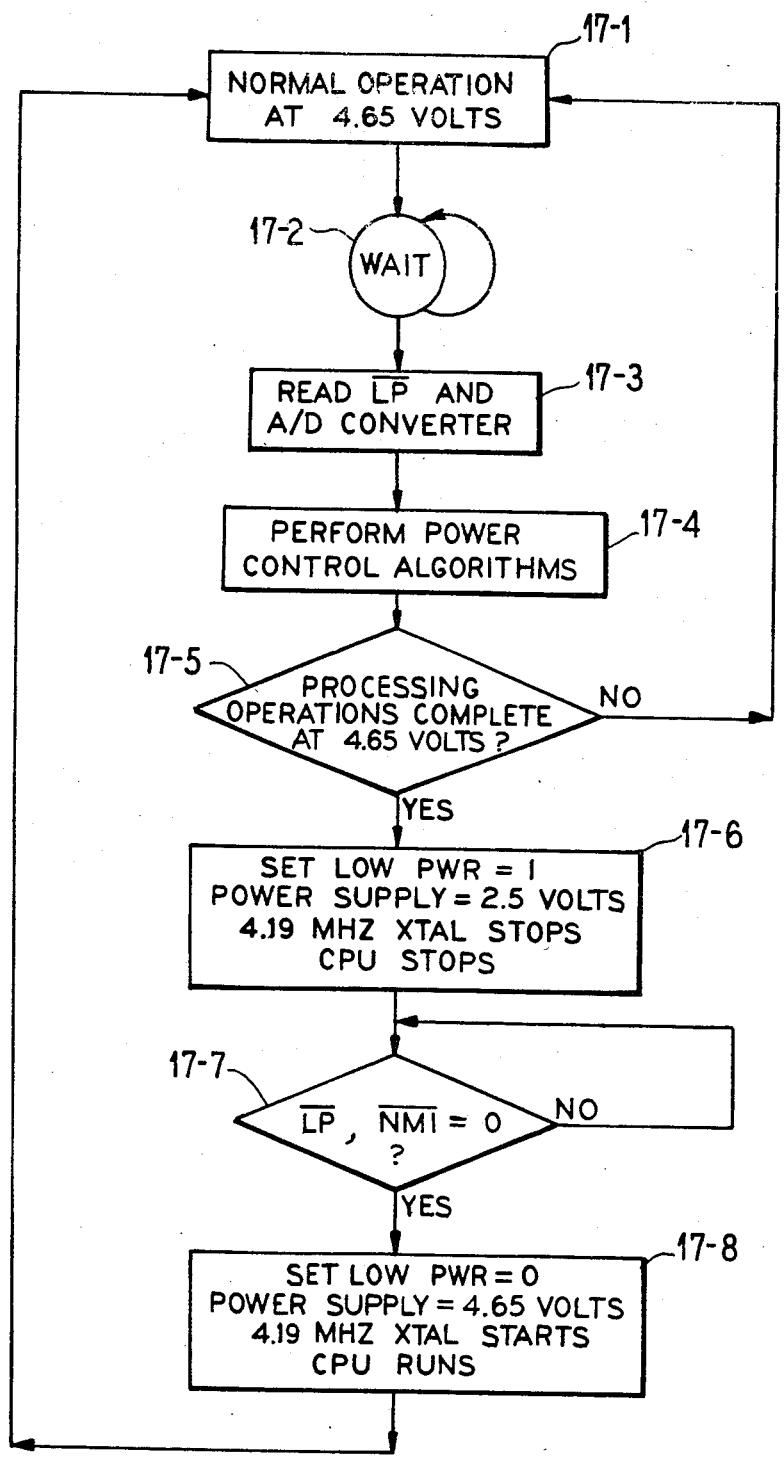

As a simplified example, processor means 18-10 may include a stored look up table wherein for respective temperature ranges, respective different settings for the desired average battery charging current are entered. An exemplary table based on FIG. 6 is as follows:

| Exemplary Table Of Desired Average Battery Charging Current As A Function Of Temperature (See FIG. 6.) | | |
|---|---|---|
| Temperature Range (°F.) | Average Battery Charging Current | Corresponding Nominal n Value |
| Below 2.5 | Zero | 0 |
| 2.5 to 35 | C/100 | 1 |
| 35 to 76 | C/20 | 5 |
| 76 to 98 | C/10 | 10 |
| 98 to 112.5 | C/6.7 | 15 |
| Over 112.5 | Zero | 0 |

If at the initiation of a battery charging operation, the temperature were in the range from 76° F. to 98° F., then a number ten (n=10) would initially be inserted into a duty cycle register. At the start of each operating cycle, switch means 18-22 would be turned on, and clock pulses of clock oscillator 18-32 would be counted until the number corresponding to the n value stored in the duty cycle register was reached. Switch means 18-22 would then be turned off.

For the case of closed loop control, sampling would take place as shown in FIG. 21. After sample ns32, a value of actual charging current would be calculated. If for example, the average actual current were calculated at 0.10C, and the battery temperature remained in the same range of 76° F. to 98° F., there would be a zero error and the value of ten would remain in the duty cycle register.

With successive samples of actual battery current and successive temperature readings, if the actual battery current were found to increase to 0.11C, the error of 0.01C could cause one count to be subtracted from the duty cycle register. If a new temperature range were measured, then the corresponding nominal n value from the foregoing table could be inserted into the duty cycle register. A more sophisticated control procedure taking account of further variables and narrower temperature ranges can be readily constructed based on the foregoing explanation.

The microprocessor 22-16 may be programmed to sample battery current during deep discharge of the battery means and during portable operation to obtain a measure of remaining battery life which may be displayed by the portable unit. See for example, Tables A and B herein.

Features of a preferred implementation of FIGS. 18, 19, 20A, 20B, 21 and 22 include the following by way of example and not of limitation:

(1)
Constant frequency duty cycle repetition rate for Vsw, e.g. a fraction of the clock rate of component 18-32 corresponding to a desired number of modulation increments per cycle of Vsw.

(2)
Digitally selectable duration for the active duty cycle of Vsw.

(3)
Current in inductor 18-24 may reach zero before the end of each cycle of Vsw as illustrated in FIGS. 19 and 20B over a range of numbers of modulation increments including a maximum charging rate, e.g. C/8, for battery 18-20.

(4)
Vsense at 18-38 is measured via a low offset voltage linear amplifier, a sample and hold circuit, and an analog to digital converter, e.g. as indicated in FIG. 22.

(5)
Processor 18-10 obtains a measure of battery current during both battery charging and battery discharging operations.

(6)
Current sense resistor 18-26 adds little to the resistance of battery means 18-20.

(7)
The actual analog current pulse waveform in resistance 18-26 is deliberately under-sampled to alias the resultant waveform (as indicated in FIG. 21) to a very low frequency so that processor 18-10 can readily obtain a measure of average charging current without requiring a high processor operating rate.

(8)
Processor 18-10 selects the duty cycle of Vsw according to ambient temperature to prolong battery life and enhance reliability of the complete hand held unit.

SUMMARY OF OPERATION

From one standpoint, the illustrated embodiment exemplifies a method of operation in a battery charging system wherein current is intermittently supplied from a voltage source means, e.g. V(+CHG), FIG. 18, to a chargeable battery means 18-20 via an energy storage means, e.g. inductance 18-24. The circuit arrangement is such that battery charging current continues to flow from the energy storage means to the battery means, e.g. via diode 18-36, at each interruption of the current flow at current regulator means 18-22. The intermittent actuation of current regulating means 18-22 produces a fluctuating battery charging current such as represented in FIGS. 19 and 20B which fluctuates in each of the successive operating cycles.

In order to obtain a measure of average battery charging current, the sampling means of component 18-10 is operated in an aliased asynchronous manner relative to the operating cycles of the battery charging current waveform such that battery charging current is sampled at respective different sampling times e.g. ts1, ts2, ts3, ..., FIG. 20B, in respective different operating cycles e.g. cycles S1, S65, S129, ..., FIG. 20A, over a certain aliased sampling time interval, e.g. as represented at ns1 to ns32, FIG. 21. Because of the clock rate of clock oscillator 18-32, FIG. 18, e.g. six megahertz, the waveform of each operating cycle such as shown in FIG. 19 could be sampled a number of times, e.g. at intervals of one-sixth microsecond, such intervals being termed potential sampling intervals. In aliased sampling however, a given cycle of the battery charging current may not be sampled at all, and for example, as shown in FIG. 20B, sampling may take place at intervals of about sixty-four operating cycles but asynchronously to the repetition interval of the operating cycles, so that successive actual sampling intervals such as ts1, ts2, ts3, ts4, ..., FIG. 20B, scan through the potential sampling points, in each of a succession of aliased sampling cycles, each such aliased sampling cycle having a duration, for example, greater than one millisecond (e.g. 43.696 milliseconds).

If, for example, the sampling takes place at N respective different potential sampling intervals, covering the potential sampling points of the operating cycle, then after N samples have been obtained, the sample values can be added and an average obtained as a measure of average battery charging current. With each new sample such as sample N plus one, the earliest sample, e.g. sample number one, can be discarded, and a new average value calculated.

In the exemplary embodiment, the battery or environmental sensing means 18-28 in conjunction with transducer 18-30 may measure an ambient temperature related to the temperature of the battery means 18-20 and determine an optimum battery charging rate based at least in part on the most recent measurement of battery temperature.

For example, for a given chargeable battery means the processor means 18-10 may be programmed to select a maximum battery charging rate consistent with assurance of prolonged battery life, e.g. avoiding an excessive overcharge rate as discussed in relation to FIG. 6.

As an example, processor means 18-10 may include a stored look up table wherein for each respective temperature range of significance, respective different settings for the desired average battery charging current are entered.

By way of example, where there is a number of potential discrete sampling intervals per operating cycle equal to the fifth power of two (32), sampling may be effected at time intervals equal to about the fifth power of two (32) times the duration of an operating cycle, or about the tenth power of two (1024) times the duration of a discrete sampling interval. For the example of a clock rate of six megahertz, the potential discrete sampling intervals may have a duration of one-sixth microsecond (about 167 nanoseconds).

Thus, the time between sampling may be substantially longer than one microsecond, e.g. of the order of one-sixth of a millisecond.

For the case where the clock time period is one-sixth of a microsecond, and the operating frame interval of an operating cycle is equal to e.g. the fifth power of two (32) times such clock time period, the operating frame period is itself greater than one microsecond (e.g. 5.33 microseconds).

It can be seen from FIG. 19 that where switch means 18-22 is to be operated with a maximum duty cycle limited to twenty clock period time intervals of one-sixth microsecond, the energy in the inductance 18-24 may be essentially dissipated in less than ten microseconds, for example in a time interval of about one-third microsecond.

From FIG. 19, it can be seen that with a duty cycle of fifty percent, i.e. with switch means 18-22 turned on for sixteen clock period intervals (about 2.67 microseconds), or even with a duty cycle of seventy percent, the current in inductance means 18-24 will be substantially zero at the end of the operating cycle.

With closed loop control of battery charging current, it would be feasible to have duty cycles of switch means 18-22 where appreciable current was flowing in inductance means 18-24 at the beginning of successive duty cycles, e.g. as indicated at 19-4, FIG. 19, since the sampling means of FIG. 22 would sample current over the entire operating cycle, and would provide a measure of total current flow in the battery means.

DEFINITION OF ALIASED SAMPLING MEANS

In the normal sampling of a periodically fluctuating current, a sufficient number of samples would be taken to obtain values in the vicinity of an abrupt change such as at 19-3, FIG. 19. With the exemplary waveform, such an abrupt change may take place at numerous discrete positions, suggesting a number of samples per cycle. An "aliased" sampling is one that takes place at intervals greater than the period of the fluctuating waveform.

It will be apparent that the various modifications and features previously mentioned can be incorporated with one or more features of FIGS. 18, 19, 20A, 20B, 21 and 22. For example, the system of FIG. 18 et seq. may form a part of a stationary battery charging system which removably receives spare battery packs, and/or which removably receives hand held units such as shown in FIG. 1. The processor means 18-10 may measure actual battery discharge current during use of the hand held unit and then control the duration of recharging according to such measure.

I claim as my invention:

1. In a control system for controlling current flow to a load, a voltage supply input means,
   controllable current regulator means controlling supply of load current from the voltage supply input means to a load, and controllable between a first mode corresponding to a relatively high current flow and a second mode corresponding to a relatively low current flow,
   energy storage means providing a load current flow path from the voltage supply input means to a load under the control of said current regulator means and operable to store energy with the regulator means in the first mode and to supply current to a load in the second mode of the regulator means, and
   control means controlling said regulator means to alternate between the first and second modes so as to supply a selected average current to the load, said control means actuating said regulator means periodically with a maximum time interval between actuations of the regulator means to the first mode of a maximum time duration accommodating a maximum duty cycle of the regulator means in the first mode, the energy storage means reaching a relatively high energy storage condition with the maximum duty cycle of the regulator means and the control means providng a minimum duty cycle of the regulator means such that the energy storage means reaches a substantially reduced energy storage condition, and said control means controlling the duty cycle of the regulator means in the range between said maximum duty cycle and the minimum duty cycle to control the average load current, said control means providing a fixed time interval between actuations of the regulator means to said first mode, and producing a periodically fluctuating load current, said control means having a load current sampling means operating at a sampling rate to define successive potential sampling intervals such that a multiple of the potential sampling interval defines an operating frame interval substantially matched with the time interval between actuations of the regulator means to said first mode, said sampling means reading the load current at asynchronous time intervals asynchronously related to the operating frame interval and effecting an aliased sampling of the periodically fluctuating load current at a sufficient number of asynchronous time intervals to obtain a measure of average load current, and said control means controlling the duty cycle of the regulator means to tend to maintain the measure of average load current obtained from the load current sampling means at a desired value.

2. In a control system according to claim 1, said regulator means, said energy storage means and said control means forming a hand held unit.

3. In a control system according to claim 2, said control means comprising a programmed processor means with clock means controlling said load current sampling means, the clock means having a clock time period equal to the duration of the potential sampling interval and less than one microsecond, the multiple of the potential sampling interval being such that the duration of the operating frame interval is greater than one microsecond.

4. In a control system according to claim 3, said multiple of the potential sampling interval being at least about thirty-two.

5. In a control system according to claim 4, said asynchronous time intervals being at least about thirty-two times greater than said operating frame interval.

6. In a control system according to claim 3, said asynchronous time intervals being at least about thirty-two times greater than said operating frame interval.

7. In a control system for controlling current flow to a load, a voltage supply input means,
   controllable current regulator means controlling supply of load current from the voltage supply input means to a load, and controllable between a first mode corresponding to a relatively high current flow and a second mode corresponding to a relatively low current flow,
   energy storage means providing a load current flow path from the voltage supply input means to a load under the control of said current regulator means and operable to store energy with the regulator means in the first mode and to supply current to a load in the second mode of the regulator means, and
   control means controlling said regulator means to alternate between the first and second means so as to supply a selected average current to the load, said control means sampling load current to obtain a measure of average load current, and controlling the relative time durations of the first and second modes so as to tend to maintain a selected average load current.

8. In a control system according to claim 7, said control means comprising processor means having environmental condition sensing means for sensing a condition relevant to load current and controlling the regulator means to tend to maintain an average load current selected in accordance with the sensed condition.

9. In a control system for conrolling current flow to a load, a voltage supply input means,
controllable current regulator means controlling supply of load current from the voltage supply input means to a load, and controllable between a first mode corresponding to a relatively high current flow and a second mode corresponding to a relatively low current flow,
energy storage means providing a load current flow path from the voltage supply input means to a load under the control of said current regulator means and operable to store energy with the regulator means in the first mode and to supply current to a load in the second mode of the regulator means, and
control means controlling said regulator means to alternate between the first and second modes so as to supply a selected average current to the load, said control means comprising processor means having environmental condition sensing means for sensing a condition relevant to load current and controlling the regulator means to tend to supply an average load current selected in accordance with the sensed condition.

10. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said control means being operable to vary the duration of a duty cycle during which the switch means is in current conductive mode to vary the charging rate of the battery means, and charging. current sensing means for detecting battery charging current and controlling said control means to produce a desired rate of charging of the battery means.

11. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said control means being operable to vary the duration of a duty cycle during which the switch means is in current conductive mode to vary the charging rate at the battery means, and charging current sensing means for detecting battery charging current and controlling said control means to produce a desired rate of charging of the battery means, said charging current sensing means sampling fluctuating battery charging current at respective different times in relation to respective different duty cycles of the switch means such as to define an effective battery charging current over a given time period as a value obtained based on an average of the samples taken during such given time period.

12. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said control means being operable to vary the duration of a duty cycle during which the switch means is in current conductive mode to vary the charging rate of the battery means, said control means having clock means operating at a constant rate for initiating the shifting of said switch means to conductive mode at uniform time intervals, the time of switching of the switch means to current flow inhibiting mode being varied by the control means to vary the charging rate of the battery means.

13. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said control means being operable to vary the duration of a duty cycle during which the switch means is in current conductive mode to vary the charging rate of the battery means, said control means having clock means operating at a constant rate to define a clock period and providing for the shifting of said switch means to conductive mode at uniform frame intervals, the time of switching of the switch means to current flow inhibiting mode being varied in respective frame intervals by the control means to vary the charging rate of the battery means, and charging current sensing means for detecting battery charging current and controlling said control means to produce a desired rate of charging of the battery means, said charging current sensing means being controlled by said clock means and sampling fluctuating battery charging current at respective different times in relation to respective different frame intervals of the switch means such as to define an effective battery charging current over a given time period as a value obtained based on an average of the samples taken during such given time period.

14. In a battery system according to claim 13, said sensing means sampling the fluctuating battery charging current at intervals of about M frame intervals, corresponding to at least about N frame intervals where each frame interval has a duration of N clock periods.

15. In a battery system according to claim 14, said sensing frame means sampling the fluctuating battery charging current at intervals which differ from M frame intervals by one clock period.

16. In a battery system according to claim 14, the number N being at least thirty-two.

17. In a battery system according to claim 16, said clock means operating at a frequency such that the frame interval is greater than one microsecond.

18. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said circuit means providing for substantial dissipation of the energy which has been stored in said inductance means during conductive mode of the switch means of a maximum duration, in less than ten microseconds.

19. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said inductance means having an inductance such that with a fifty percent duty cycle of said switch means, the charging current from the inductance means is substantially zero at times when the switch means is switched to conductive mode at the beginning of successive duty cycles.

20. In a control system including rechargeable battery means and input means for supplying a charging current to the battery means,
controllable switch means controlling supply of current via the input means, and switchable to a current conductive mode and to a current flow inhibiting mode,
inductance means for receiving current flow from the input means when the switch means is in the current conductive mode,
circuit means providing for supply of charging current from the inductance means to the battery means while the switch means is in the current flow inhibiting mode, and
control means operating to shift the switch means between current conductive mode and current flow inhibiting mode to control the rate of charging of the battery means, said control means comprising a microprocessor programmed to control duty cycle of the switch means according to ambient temperature.

21. In a battery system according to claim 20, said microprocessor being coupled with said battery means to measure discharge current from the battery means in a discharge mode of the battery means.

22. In a battery charging system,
a method of operation which comprises intermittently supplying current from a voltage source means to a chargeable battery means via an energy storage means in successive operating cycles such that battery charging current continues to flow from the energy storage means to the battery means at interruptions of the current from the voltage source means to the energy storage means, to produce a fluctuating battery charging current which fluctuates in successive operating cycles, and sampling the fluctuating battery charging current at respective different sampling times in respective different operating cycles such that an average of the sum of the samples over a given time interval represents a measure of average battery charging current during such time interval, further comprising establishing a number N of successive discrete time intervals of equal duration in each operating cycle, and varying the number n of such discrete time intervals during which the current is supplied from the voltage source means to the energy storage means in respective operating cycles to vary the average battery charging current, further comprising sampling the fluctuating battery charging current at least about N respective different discrete sampling times during at least about N respective different operating cycles to obtain a measure of average battery current over a time interval which is of long duration in comparison to the duration of N successive discrete time intervals.

23. The method of claim 22, wherein N is at least of the order of the fifth power of two.

24. The method of claim 23, wherein the fluctuating battery charging current is only sampled at intervals of at least about the sixth power of two times the duration of N successive discrete time intervals.

25. In a battery charging system,
a method of operation which comprises intermittently supplying current from a voltage source means to a chargeable battery means via an energy storage means in successive operating cycles such that battery charging current continues to flow from the energy storage means to the battery means at interruptions of the current from the voltage source means to the energy storage means, to produce a fluctuating battery charging current which fluctuates in successive operating cycles, and sampling the fluctuating battery charging current at respective different sampling times in respective different operating cycles such that an average of the sum of the samples over a given time interval represents a measure of average battery charging current during such time interval, further comprising obtaining a measure of the average battery charging current based on each new sample of the fluctuating battery charging current and the other samples taken within the duration of the given time interval from such new sample.

26. In a control system, operation means establishing a load current flow which fluctuates in successive operating cycles, said operation means being operable for varying a parameter in a substantial number, N, of discrete steps per operating cycle to correspondingly vary the load current per operating cycle, and said operation means sampling the load current flow at respective different discrete sampling intervals in respective different operating cycles such that the sampling rate is markedly less than N times per operating cycle, but such that an average of the sum of the samples over a given time interval provides a measure of average load current.

27. In a control system according to claim 26, said operation means being operable for varying the time duration of an activating current in N discrete steps together covering an operating time T to correspondingly vary the load current per cycle.

28. In a control system according to claim 27, said operation means sampling the load current at discrete sampling intervals each having a time duration substantially corresponding to operating time T divided by the number of discrete steps N, and the sampling rate being not greater than of the order of once per operating cycle.

29. In a control system according to claim 28, said operation means comprising a programmed processor means having a clock rate determining the number of discrete steps per operating cycle, and said programmed processor means effecting sampling of the load current flow at said sampling rate which is not greater than of the order of once per operating cycle.

30. In a control system according to claim 26, said operation means sampling the load current flow at a sampling rate not greater than of the order of once per operating cycle.

31. In a control system according to claim 26, said operation means comprising a programmed processor means having a clock rate determining the number of discrete steps per operating cycle, and said programmed processor means effecting sampling of the load current flow at said sampling rate which is substantially less than once per operating cycle.

32. In a control system, a method of operation comprising establishing a load current flow which fluctuates in successive operating cycles, varying a parameter in different operating cycles over a range comprised of a substantial number N discrete steps per operating cycle, to correspondingly vary the load current in the different operating cycles, sampling the load current flow at a lower rate and at respective different discrete sampling intervals in respective different operating cycles, and obtaining an average of the sum of the samples over a given time interval as a measure of average load current.

33. A method according to claim 32, wherein the load current flow is sampled at a rate which is substantially less than once per operating cycle.

* * * * *